(12) United States Patent
Podrazhansky et al.

(10) Patent No.: US 6,307,379 B2
(45) Date of Patent: Oct. 23, 2001

(54) RAPID DETERMINATION OF PRESENT AND POTENTIAL BATTERY CAPACITY

(75) Inventors: Yury M. Podrazhansky; Yefim Y. Kusharskiy, both of Norcross, GA (US)

(73) Assignee: Enrev Corporation, Norcross, GA (US)

(*) Notice: Subject to any disclaimer, the term of this patent is extended or adjusted under 35 U.S.C. 154(b) by 0 days.

(21) Appl. No.: 09/797,998

(22) Filed: Mar. 2, 2001

Related U.S. Application Data

(62) Division of application No. 09/241,687, filed on Feb. 2, 1999.

(51) Int. Cl.$^7$ .................................................. G01N 27/416
(52) U.S. Cl. ........................... 324/432; 324/429; 320/132
(58) Field of Search .................................... 320/129, 132, 320/161; 324/429, 432

(56) References Cited

U.S. PATENT DOCUMENTS

| | | |
|---|---|---|
| 5,307,000 | 4/1994 | Podrazhansky . |
| 5,694,023 | 12/1997 | Podrazhansky . |
| 5,721,688 | 2/1998 | Bramwell . |
| 5,998,968 * | 12/1999 | Pittman et al. ........................ 320/130 |
| 6,137,261 * | 10/2000 | Kurle et al. ........................... 320/132 |

FOREIGN PATENT DOCUMENTS

| | | |
|---|---|---|
| 2769095 | 4/1999 | (FR) . |
| WO98/58270 | 12/1998 | (WO) . |
| WO99/17128 | 4/1999 | (WO) . |
| PCT/US00/ 02489 | 7/2000 | (WO) . |

* cited by examiner

Primary Examiner—Gregory J Toatley, Jr.
(74) Attorney, Agent, or Firm—Troutman Sanders, LLP.; Charles L. Warner (57) ABSTRACT

Rapid determination of the condition or charge parameters of a battery, such as the present charge of the battery and the maximum charge capacity of the battery. A plurality of discharge pulses (210) and a plurality of rest periods (220) are applied to the battery. The battery voltage is then measured to provide voltages (225) during the rest periods, and/or voltages (230) during the discharge pulses. The voltage difference among selected one of the voltages are used to provide a difference voltage DELTA-L. The difference voltage DELTA-L is then used to determine a charge parameter of the battery, such as the maximum charge capacity or condition of the battery and the present charge in the battery. This information is then displayed to a user so that the user will know the present capacity and the present charge of the battery and can make an informed decision as to whether the battery is adequate for the project that the user has in mind, or to a subsequent process, such as a charging process.

30 Claims, 4 Drawing Sheets

RAPID DETERMINATION OF PRESENT AND POTENTIAL BATTERY CAPACITY

This is a divisional of U.S. patent application Ser. No. 09/241,687 filed Feb. 2, 1999, which is hereby incorporated herein by reference.

TECHNICAL FIELD

This invention relates to rechargeable storage batteries and, more particularly, to a rapid determination of the condition or charge parameters of a battery, such as potential maximum charge capacity of a battery and the present charge of the battery.

BACKGROUND OF THE INVENTION

Cellular telephones, pagers, hand held games, portable radios, tape recorders, compact disk players, "boom" boxes, two-way mobile radios, laptop and portable computers, portable power tools, golf carts, electric vehicles, and powered wheelchairs all have at least one thing in common: they all use batteries. When getting ready to leave the home or office with one of these devices the user will ask himself one or more of the following questions: When did I last charge the battery? How much have I used it since then? Is there enough charge in the battery to last through my meeting or flight or trip? What is the state of my backup battery? When did I last charge it?

These questions go unanswered as batteries do not provide an indication of their present capacity. Some devices attempt to estimate the remaining charge by measuring the current drawn from the battery and the time that it is drawn. However, this method does not account for the natural discharge of the battery or the fact that an older battery may not be able to charge to 100% of its rated capacity.

Therefore, there is a need for a user to be able to quickly determine the present and potential capacity of a battery so that the user can make a decision as to whether to recharge the battery, or to bring a spare battery, or to install another battery.

SUMMARY OF THE INVENTION

The present invention provides for rapid determination of the charge parameters of a battery, such as the present charge of the battery and the potential or maximum charge capacity of the battery. One or more discharge pulses and rest periods are applied to the battery. The battery voltage is measured to provide voltages during the rest periods, and/or voltages during the discharge pulses. The voltage differences among two or more of these measured voltages are used, alone or with the open circuit battery voltage, as an input to a curve, or a look-up table, or to an equation or algorithm, to determine the maximum capacity or condition of the battery and the present charge in the battery. This information is then displayed to the user so that the user will know the maximum capacity and the present charge of the battery. The user can then make an informed decision as to whether the battery is adequate for the project that the user has in mind. The charge parameters may also be output to another process, such as a charging process, to control or alter that process.

There are several different embodiments of the invention. These embodiments involve applying one or more rest periods and discharge pulses to the battery, taking one or more voltage measurements during the rest periods and/or the discharge pulses, determining a difference voltage, and using the difference voltage, alone or with an open circuit voltage, to determine one or more of the charge parameters of the battery. For example, one embodiment is applying a first rest period to the battery, applying a discharge pulse to the battery, applying a second rest period to the battery, measuring a first open circuit voltage of the battery during the first rest period, measuring a second open circuit voltage of the battery during the second rest period, determining a difference voltage by subtracting the second open circuit voltage from the first open circuit voltage, using the difference voltage to determine a charge parameter of the battery, and outputting the charge parameter. Another embodiment is applying a first rest period to the battery, applying a discharge pulse to the battery, applying a second rest period to the battery, measuring a first open circuit voltage of the battery during the first rest period, measuring a second open circuit voltage of the battery during the second rest period, determining a difference voltage by subtracting the second open circuit voltage from the first open circuit voltage, using the first open circuit voltage and the difference voltage to determine a charge parameter of the battery, and outputting the charge parameter.

Another embodiment is applying a plurality of rest periods and a plurality of discharge pulses to the battery, measuring a first loaded circuit voltage of the battery at a first point during a selected one of the discharge pulses which is subsequent to the selected one of the rest periods, measuring a second loaded circuit voltage of the battery at a second point during the first selected one of the discharge pulses, determining a difference voltage by subtracting the second loaded circuit voltage from the first loaded circuit voltage, using the difference voltage to determine a charge parameter of the battery, and outputting the charge parameter. Still another embodiment is applying a plurality of rest periods and a plurality of discharge pulses to the battery, measuring an open circuit voltage during a selected one of the rest periods, measuring a first loaded circuit voltage of the battery at a first point during a selected one of the discharge pulses which is subsequent to the selected one of the rest periods, measuring a second loaded circuit voltage of the battery at a second point during the first selected one of the discharge pulses, determining a difference voltage by subtracting the second loaded circuit voltage from the first loaded circuit voltage, using the first open circuit voltage and the difference voltage to determine a charge parameter of the battery, and outputting the charge parameter.

Some other variations and embodiments are described below.

Other features, and advantages of the present invention will become apparent upon reading the following description of the preferred embodiment, when taken in conjunction with the drawings and the claims.

DETAILED DESCRIPTION OF THE INVENTION

Figure 1:
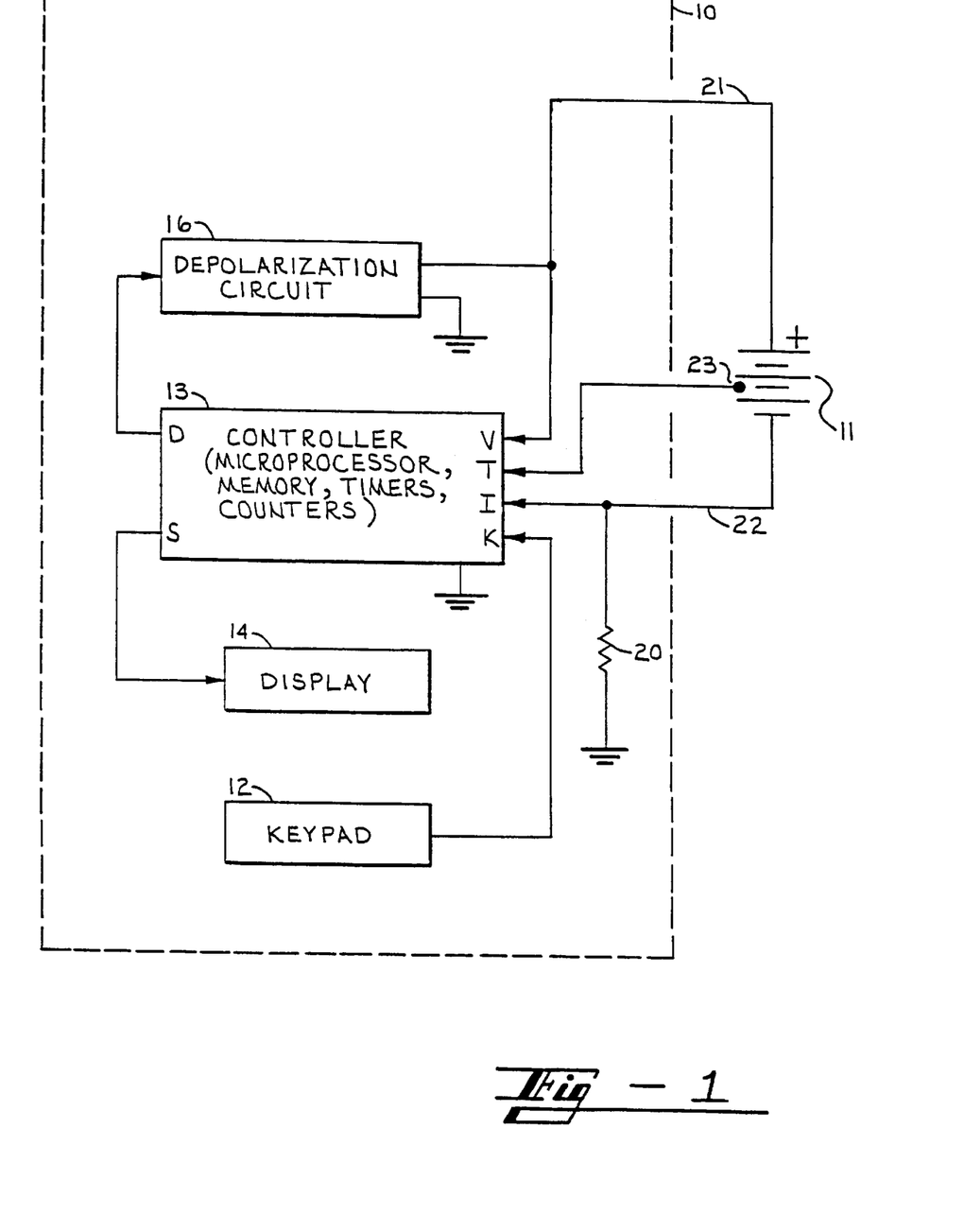
FIG. 1 illustrates the preferred embodiment of a circuit to implement the present invention.

Turning now to the drawing, FIG. 1 illustrates the preferred embodiment of a circuit to implement the present invention. The circuit 10 comprises a user control panel 12, such as a keypad, a controller 13, a display 14, a discharge circuit 16, and a current monitoring circuit 20. The keypad 12 is connected to the "K" input of the controller 13 and allows the user to input specified parameters such as the battery type (Lithium ion, lead acid, NiCad, NiFe, NiMH, etc.), and other relevant information, such as a nominal battery voltage or number of cells in series. The user control panel 12 may be a keyboard, dial pad, array of switches, or other device for entering information or instructions. To simplify operation by the user, the controller 13 may be preprogrammed with the parameters for a plurality of battery types. In this case the user would simply enter a battery type, such as a model number, and the controller 13 would automatically use the parameters appropriate for that battery type. The display 14 is connected to the "S" output of the controller 13 and displays the information, choices, parameters, etc., for the operator. If the circuit is always to be used for only a single type of battery, such as a specified type of battery pack for a laptop computer, then the user control panel 12 may consist only of a "TEST" switch. Similarly, the display may only be an LED/LCD readout, or one or more bar graphs, or other suitable display. The display may indicate any desired data, or may simply indicate the maximum capacity and the present charge, such as "1350 maH maximum capacity" and "675 maH present capacity". Of course, if the power consumption of the device using the battery is known then the display may indicate the corresponding times, such as "5 hours maximum capacity" and "2.5 hours remaining capacity". Also, the information may be output to another process, such as a charging process, and the "S" output or another output from the controller 13 may be used to output this information to such other process.

The "D" output of the controller 13 is connected to the discharge circuit 16, which may be configured by the controller 13 to provide a constant discharge current or apply a selected load to the battery. The pulse width of the pulses provided by the discharge circuit 16 is controlled by the controller 13. The discharge circuit 16 is connected to the positive terminal of the battery 11 via the conductor 21. The negative terminal of the battery 11 is connected to circuit ground through a resistor 20, which has a nominal value of 0.01 ohm. Current flowing out of the battery 11 must pass through the resistor 20. The current through the battery 11 may therefore be determined by measuring the voltage across the resistor 20. Of course, other devices, such as Hall effect devices, may be used to determine battery current.

The battery voltage is monitored by measuring the voltage between the conductor 21 and circuit ground. The effects of the resistor 20 may be eliminated by measuring the voltage between the conductors 21 and 22, or by subtracting the voltage on the conductor 22 from the voltage on the conductor 21. The conductors 21 and 22 are connected to the V and I inputs, respectively, of the controller 13. It will be appreciated that if the controller 13 is a logic device, such as a microprocessor, then the signals must be converted to a form usable by the controller 13, such as by an analog-to-digital converter.

Battery presence maybe determined by activating the discharge circuit 16 and monitoring the output of the current monitor 20 to determine if a discharge current is flowing, or by deactivating the depolarization circuit 16 and monitoring the voltage to determine if a battery is present.

The temperature sensor 23 is connected to the "T" input of the controller 13 and may be used, if desired, to measure the temperature of the battery 11 so that the temperature of the battery may be considered in determining the condition and present charge of the battery 11. However, in many applications the battery temperature is not a significant factor or is not considered, such as when a room temperature operating environment is presumed, and the sensor 23 may be omitted in such applications.

In the preferred embodiment the controller 13 comprises a microprocessor, a memory, at least part of which contains operating instructions for the controller 13, timers, and counters. The timers and counters, which may be discrete devices or a part of the microprocessor, may be used for controlling the discharge pulse duration or the rest period duration, counting the number of discharge pulses or rest periods applied, etc.

In the preferred embodiment, the controller 13 causes discharge pulses to be applied to the battery, measures the battery voltage at predetermined points, and then, based upon those voltage measurements, determines the battery charge parameters, such as the maximum potential charge and the present charge.

Figure 2:
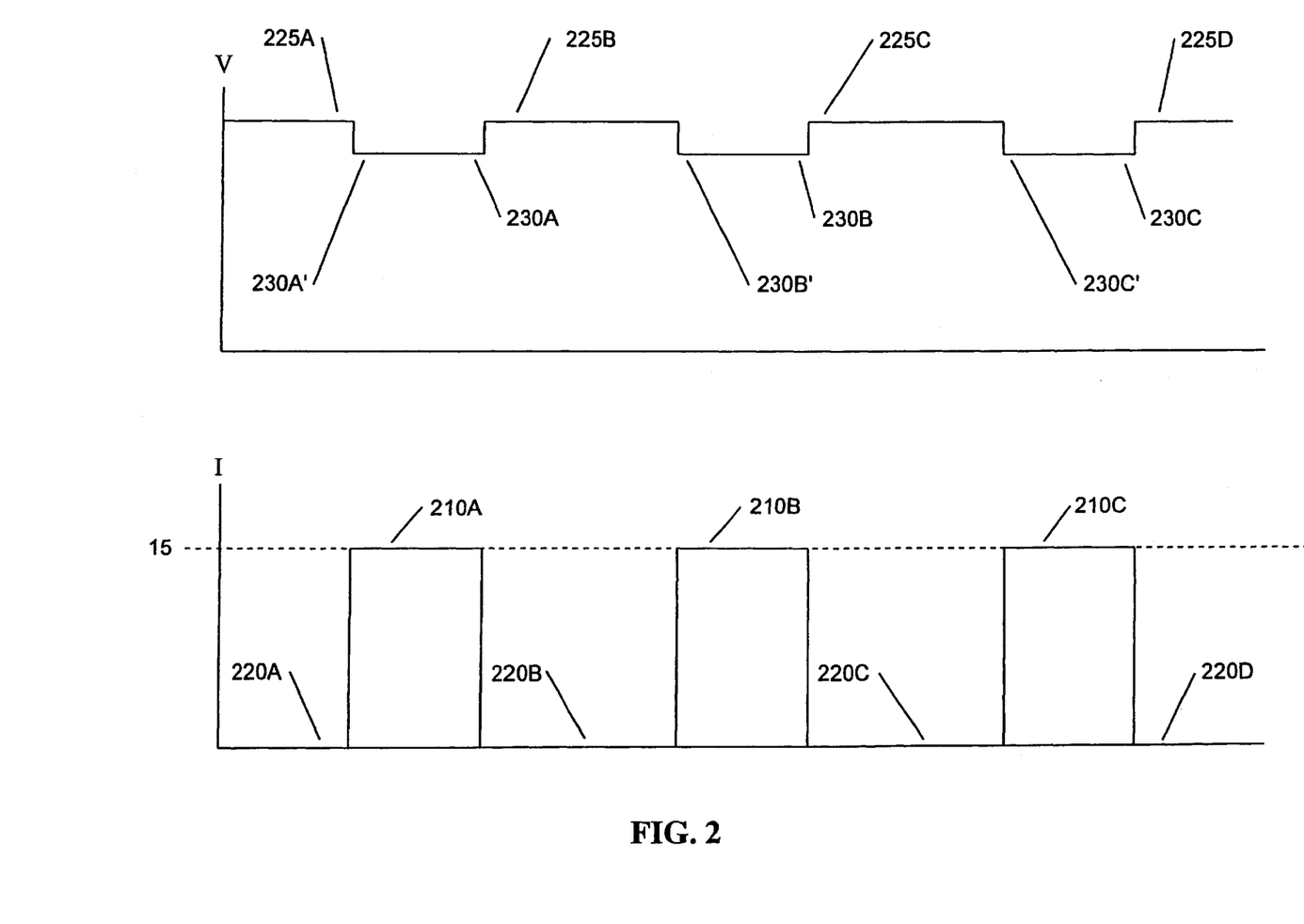
FIG. 2 illustrates a waveform which shows the voltage measurements used to determine the condition of the battery.

FIG. 2 illustrates a waveform which shows the voltage measurements used to determine the charge parameters of the battery 11. In the preferred embodiment, two or more discharge pulses 210 are applied to the battery 11 under test and battery voltage measurements 225, 230 are taken in two of the rest periods 220 around the discharge pulses 210, or during one of the rest periods 220 and at least one of the discharge pulses 210. Two or more of these voltage measurements are then used to determine the charge parameters of the battery.

The maximum charge capacity of a battery is determined by one or more factors, depending upon the type of battery, such as the age of the battery, the present temperature of the battery, prior overheating of the battery, prior freezing of the battery, prior overcharging of the battery, prior over-discharging of the battery, prior and current water and electrolyte levels of the battery, and other electrical, chemical, or mechanical history or abuse of the battery. A difference voltage DELTA-L, as defined below, provides information as to the condition of the battery, that is, the potential or maximum capacity of the battery. The difference voltage DELTA-L is compared to DELTA-L difference voltage values previously determined empirically using batteries of known charge capacities. The DELTA-L difference voltages used for evaluating the charge capacity of a battery are determined for each type of battery (Lithium ion, NiCad, NiMH, NiFe, lead-acid, etc.), and for each capacity rating (600 milliamp-hours (maH), 1500 maH, 2500 maH, etc.) of a type of battery.

Generally, the lower the DELTA-L difference voltage is, the higher is the maximum possible charge level of the battery. Conversely, the higher the DELTA-L difference voltage is, the lower is the maximum possible charge level of the battery. The DELTA-L difference voltage levels used for comparison for evaluating the maximum charge potential of a battery are determined empirically for each type of battery (Lithium ion, NiCad, NiMH, lead-acid, etc.) and for each capacity rating (600 milliamp-hours (maH), 1500 maH, 250,000 maH, etc.) of a type of battery. For example, the DELTA-L voltage might be 20 mv for a new, fully charged battery, and might be 75 mv for an older, weaker battery.

Figure 3:
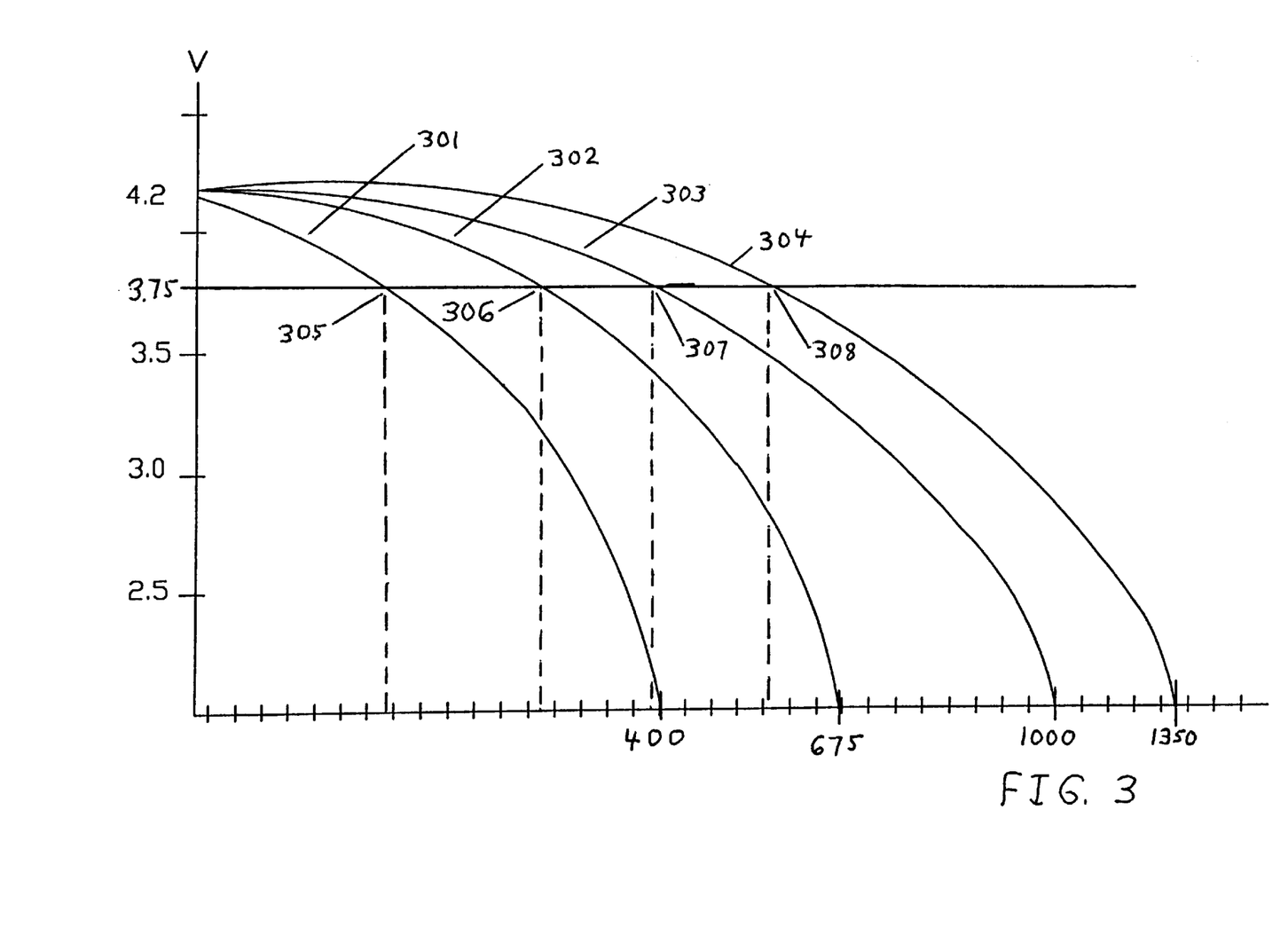
FIG. 3 is a chart illustrating how the voltage measurements are used to determine the condition of the battery.

FIG. 3 is a chart illustrating how the DELTA-L voltage and the open circuit voltage are used to determine the maximum potential charge and the present charge of the battery. Exemplary discharge curves 301, 302, 303, and 304 for a battery are shown. If the battery has a capacity of 1350 maH (milliamp-hours) then the discharge curve will be curve 304. If the battery has a capacity of 1000 maH, 675 maH, or 400 maH then the discharge curve will be curve 303, 302 or 301, respectively.

An open circuit voltage of X volts will indicate a higher present charge level for a battery on one curve than the same open circuit voltage for a battery on another curve. If the open circuit battery voltage is, for example, 3.75 volts then, using only the open circuit voltage of the battery, one cannot determine the present charge of the battery because the open circuit battery voltage of 3.75 volts may represent any one of points 305, 306, 307, or 308 on curves 301, 302, 303, or 304.

This problem is overcome by the present invention by the use of the DELTA-L difference voltage to determine a charge parameter of the battery, such as the maximum charge capacity of the battery. The DELTA-L voltage may be, for example, "X" millivolts (mv) for a new, fully charged battery, but may be "Y" mv for an older, weaker battery. For example, based upon empirical data, a DELTA-L voltage of "X" mv for a particular type of battery may indicate a battery with maximum capacity of 1350 maH, and a DELTA-L voltage of "Y" mv may indicate a maximum capacity of 675 maH. Therefore, the DELTA-L voltage of the battery under test is determined, and this DELTA-L voltage is used to determine the appropriate curve for that battery and thereby indicate the maximum potential charge of the battery.

In the preferred embodiment, the empirical data is used to generate one or more look-up tables showing the relationship between the DELTA-L voltage and the potential maximum battery capacity. Of course, the more empirical data that is collected, the more accurate the tables will be. However, if only a few empirical data points are available, then the empirical data or the table results may be extrapolated or interpolated to determine the potential charge capacity of the battery. Also, algorithms or equations may be derived based upon the empirical data and these algorithms or equations may be used instead of, or along with, the tables, along with the DELTA-L voltage to determine the potential battery capacity.

Once the proper curve for the battery has been thus determined, the open circuit voltage is then used to indicate another charge parameter, such as the present charge (sometimes called the residual charge) of the battery. The reference open circuit voltage values are also determined empirically using batteries of known maximum capacity and known present charge. The reference open circuit voltage values used for evaluating the present charge of a battery are determined for each type of battery (Lithium ion, NiCad, NiMH, NiFe, lead-acid, etc.), and for each capacity rating (600 milliamp-hours (maH), 1500 maH, 250,000 maH, etc.) of a type of battery.

Therefore, the use of the DELTA-L voltage and the open circuit voltage have indicated the charge parameters of that battery, such as which curve 301–304 and which point 305–308 are correct for that battery. The curve 301–304 directly indicates the maximum potential capacity of the battery. For example, curve 301 indicates a maximum potential capacity of 400 maH, and curve 304 indicates a maximum potential capacity of 1350 maH. Once the proper curve is determined, the open circuit voltage is used to determine the present capacity.

For example, if the battery is on curve 303 then it has a maximum potential capacity of 1000 maH. If the open circuit voltage is 3.75 volts then the battery is currently at point 307. Dropping down from point 307 to the capacity axis, one sees that 400 maH have been used out of the 1000 maH maximum capacity. Therefore, the battery has a residual charge of 600 maH (1000 maH maximum capacity less 400 maH already used).

Also by way of example, if the battery is on curve 302 then it has a maximum potential capacity of 675 maH. If the open circuit voltage is 3.75 volts then the battery is currently at point 306. Dropping down from point 306 to the capacity axis, one sees that approximately 300 maH have been used out of the 675 maH maximum capacity. Therefore, the battery has a residual charge of 375 maH (675 maH maximum capacity less 300 maH already used).

Returning now to FIG. 2, the measurement of the DELTA-L voltage will be described. One or more relatively-large magnitude discharge pulses 210A, 210B are applied to the battery, the battery voltage is measured at predetermined points, and the charge parameters of the battery are determined based upon those voltage measurements.

In the preferred embodiment, two discharge pulses 210A, 210B are used, open circuit voltage measurement 225A is preferably taken at the end of rest period 220A, and loaded circuit voltage measurements 230A and 230B are preferably taken at the end of the discharge pulses 210A, 210B. A difference voltage DELTA-L1 is then determined by subtracting voltage 230B from voltage 230A. As an example, a typical DELTA-L1 for a fully charged, new Lithium-ion battery would be 10 mv, and for a mostly discharged, weaker battery would be 40 mv. the difference voltage is then used to determine one charge parameter, such as the maximum battery capacity, and the open circuit voltage is then used to determine another charge paramneter, such as the present charge of the battery.

In another embodiment, only one discharge pulse 210A is needed, and open circuit voltage measurement 225A is preferably taken at the end of rest period 220A, and open circuit voltage measurement 225B is preferably taken at the beginning of the rest period 220B. A difference voltage DELTA-L2 is then determined by subtracting voltage 225B from voltage 225A.

In another embodiment, there are two or more discharge pulses 210, open circuit voltage measurement 225A is preferably taken during rest period 220A, and another open circuit voltage measurement is taken, preferably at the beginning of a rest period following a discharge pulse 210, such as voltage 225C taken following discharge pulse 210B, or voltage 225D taken following discharge pulse 210C. A difference voltage DELTA-L3 is then determined by subtracting voltage 225B (or voltage 225C, or voltage 225D) from voltage 225A. Or the open circuit voltage measurement 225B could be the first open circuit voltage measurement, and the difference voltage DELTA-L3 is determined by subtracting voltage 225C (or voltage 225D, or voltage 225N) from voltage 225B.

In another embodiment, only one discharge pulse 210A is used, and open circuit voltage measurement 225A is preferably taken at the end of rest period 220A, and loaded circuit voltage measurement 230A' is preferably taken at the beginning of the discharge pulse 210A, and loaded circuit voltage measurement 230A is preferably taken at the end of the discharge pulse 210A. A difference voltage DELTA-L4 is then determined by subtracting voltage 230A from voltage 230A'.

In another embodiment, there are two or more discharge pulses 210, the open circuit voltage is measured at the end of a rest period just prior to the selected discharge pulse 210N, the voltage under load is measured at the beginning of a discharge pulse 210 to provide voltage 230N', and the loaded circuit voltage is also measured at the end of the selected discharge pulse to provide voltage 230N. In this embodiment, DELTA-LN is determined as the difference in the voltage during a selected discharge pulse 210. DELTA-L5B will therefore be voltage 230B' minus voltage 230B, and DELTA-L5C will be voltage 230C' minus voltage 230C, and so on.

Therefore, generally stated, an open circuit voltage is measured, and then subsequent voltage measurements are taken during discharge pulses 210 or during rest periods 220, and the voltage differences in a discharge pulse 210 or in a rest period 220, or the voltage differences between discharge pulses 210 or between rest periods 220, are used to generate a DELTA-L measurement. This DELTA-L measurement is then used to determine the maximum potential battery capacity and the appropriate operating curve for the battery, and an open circuit voltage is then used to determine the present charge level of the battery.

The DELTA-L to be used may be a simple DELTA-L, that is, a simple open circuit DELTA-L (DELTA-L2, DELTA-L3) or a simple loaded circuit DELTA-L (DELTA-L1, DELTA-L4, DELTA-L5). The DELTA-L may also be a complex DELTA-L, that is, a combination of one or more of the simple open circuit DELTA-Ls and/or one or more of the simple loaded circuit DELTA-Ls. For example, the DELTA-L to be used may be DELTA-L1 minus DELTA-L2, or DELTA-L1 times DELTA-L3, or some other sum or product or quotient of two or more simple DELTA-Ls. Thus, in another embodiment, two or more of the DELTA-L voltages are combined to determine the charge parameter for the battery, such as which curve is the correct operating curve for the battery. Therefore, the curves in FIG. 3 might be based upon the sum of DELTA-L1 and DELTA-L2, or the product of DELTA-L1 and DELTA-L2, or the sum or product of three or more of the DELTA-L measurements.

For convenience of illustration the discharge pulses 210 are illustrated as rectangular pulses but it will be appreciate that this is frequently not the case in actual practice and therefore the present invention should be understood as including but not requiring the use of such rectangular waveforms. Also, the discharging pulses 210 are shown as having the same pulse width for convenience and not as an indication of any limitation. The discharging pulses 210 preferably, but not necessarily, have the same or approximately the same current amplitude 215. The number of the discharging pulses 210 shown is purely for convenience and not by way of limitation. However, a discharge pulse draws power from the battery so the number of discharge pulses should preferably be limited to that number needed to determine the desired charge parameters of the battery. Likewise, the rest periods 220 are shown as having the same duration for convenience and not by way of limitation. In addition, the difference between the voltages 225 and the voltages 230 is exaggerated for clarity of illustration. Also, for clarity of illustration, the differences between the voltages 225A–225D are not shown, and the differences between the voltages 230A–230C are not shown, as these differences will be very small in comparison to the actual voltages. However, as indicated herein, these small differences are important and are used by the present invention to determine the battery condition and charge.

The particular position within a rest period when the voltage measurement is made is somewhat critical and the voltages are preferably measured at the points specified herein. The voltage measurements will differ depending upon when the measurements are made, so the voltage measurements for the battery under test should made at the same points within the same rest period as the empirical voltage measurements.

Likewise, the particular position within a discharge pulse when the voltage measurement is made is somewhat critical and the voltages are preferably measured at the points specified herein. The voltage measurements will differ depending upon when the measurements are made and so the measurements of the battery under test should be made at the same points within the discharge pulses as those points used to generate the empirical voltage measurements.

Similarly, although FIG. 2 shows measurements being taken before and during the first discharge pulse, and during and after the second discharge pulse, the discharge pulses used for the measurements are not critical. For example, measurements could be taken before the first discharge pulse, during the second discharge pulse, during the fifth discharge pulse, and after the sixth discharge pulse.

However,, the voltage measurements will differ depending upon when the measurements are made and so the measurements of the battery under test should be made at the same points with respect to the same rest periods or discharge pulses as those used to generate the empirical voltage measurements.

The magnitudes and durations of the discharge pulses are somewhat critical. The durations of the discharge pulses and the wait periods (also called rest periods) are dependent upon the type of battery being tested. For a Lithium ion battery, the discharge pulses 210 may have amplitudes of 4 amps and durations of 50 milliseconds, and the wait periods 220 may have durations of 100 milliseconds. For NiCad or NiMH batteries, the discharge pulses may have amplitudes of 4 amps and durations of 20 milliseconds, and the wait periods may have durations of 100 milliseconds. However, as above, the voltage measurements will differ depending upon these factors and so the measurements of the battery under test should be made under the same conditions as the empirical voltage measurements.

Thus, in accordance with the present invention, one or more of the measurements DELTA-L1, DELTA-L2, etc. have been used to determine a charge parameter of the battery, such as the condition of the battery, as in the present maximum capacity level of the battery, and the open circuit voltage has then been used to determine another charge parameter of the battery, such as the remaining charge in the battery. Therefore, the user can insert the battery into the test device and quickly (within a couple of rest periods) determine whether that battery will suffice for the job that is to be done, or how long that battery can be expected to provide power for a particular job.

Figure 4:
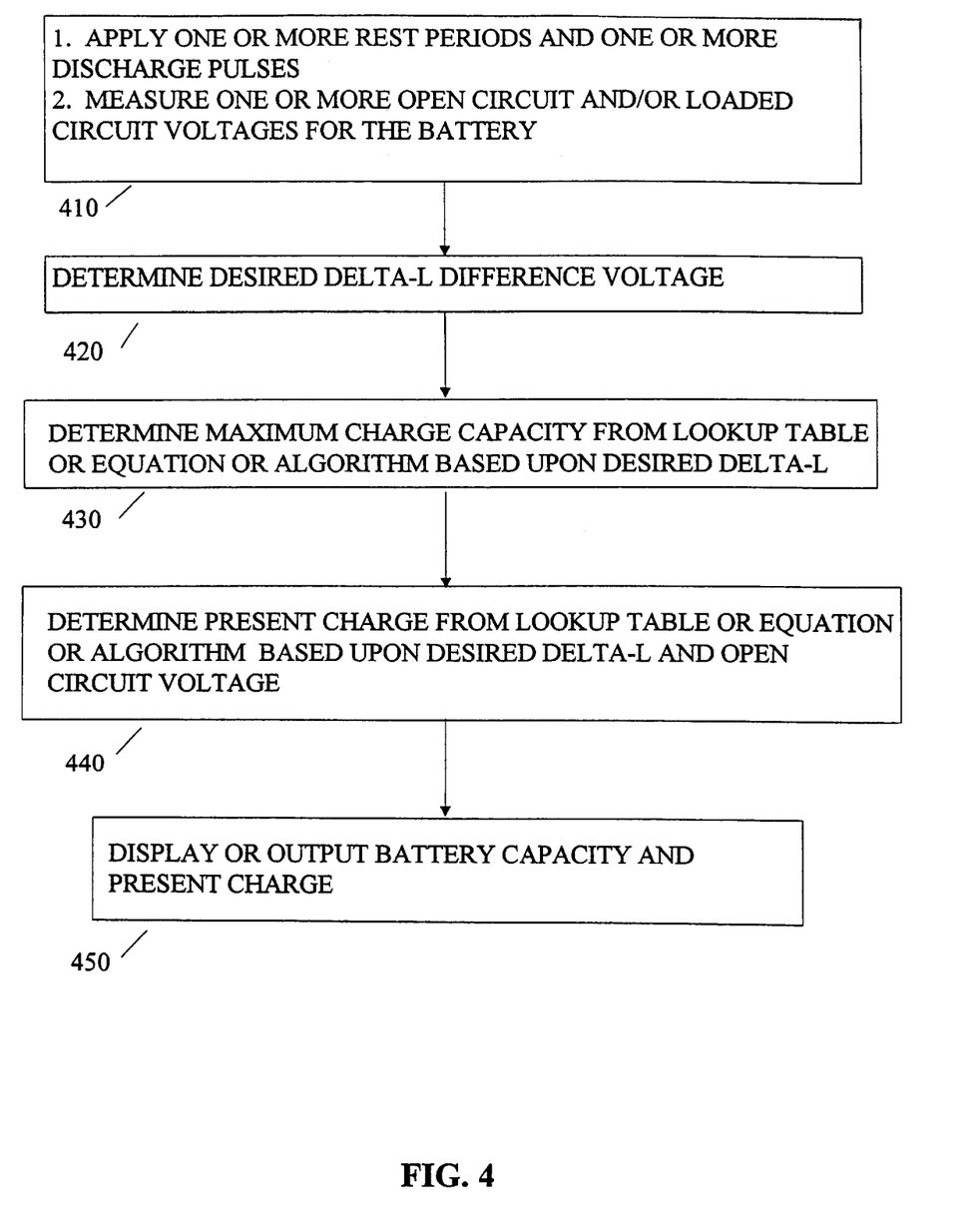
FIG. 4 is a flow chart of the operation of the present invention.

FIG. 4 is a flow chart of the operation of one embodiment of the present invention. This operation is preferably controlled by the controller 13. In step 410, one or more rest periods and one or more discharge pulses are applied to the battery. One or more open circuit and/or loaded circuit battery voltages are then measured at the desired points in the rest periods and/or the discharge pulses. As one example, if a rest period is used followed by one discharge pulse then voltage measurements 225A, 230A, and 230A' would be taken. Thus, the basic voltage measurements have now been obtained.

In step 420, the desired DELTA-L difference voltage measurement is determined. As indicated above, this may be a simple DELTA-L or a complex DELTA-L. Thus, the measurements needed to determine the condition or charge parameters of the battery have now been obtained.

In step 430, one parameter of the battery, such as the maximum potential charge capacity of the battery, is determined based upon the desired DELTA-L measurement.

In step 440, another charge parameter of the battery, such as the present charge level of the battery, is determined based upon an open circuit voltage measurement and the desired DELTA-L measurement.

Thus, in steps 430 and 440, the condition of the battery, or the charge parameters of the battery, such as the maximum potential charge capacity and the present charge level of the battery, are determined from a look-up table, or an algorithm, or both, based upon the DELTA-L measurement and the open circuit voltage measurement.

In step 450, the charge parameters of the battery, such as the potential maximum battery capacity and/or the present charge level of the battery, are then output, such as by being displayed to the user or provided to another process, such as a charging process.

Thus, the user now has compete information about the charge parameters or condition of the battery, that is, the user now knows the charge capacity of the battery and the present charge of the battery. The user can therefore determine whether the battery is adequate for the user's needs, or whether a spare battery should be brought along, or whether the battery should be replaced, or whether the battery should be recharged.

As stated above, the potential maximum battery capacity and/or the present charge level of the battery may also be output to control another process, such as to begin the process of charging the battery, or to alter the process of charging the battery, or to terminate the process of charging the battery. For example, if the maximum potential capacity is 1000 maH, and the present charge level is 250 maH, then it may be desirable to start the charging process. Or if the maximum potential capacity is 1000 mah, and the present charge level is 990 maH, then it may be desirable to alter or stop the charging process. An exemplary charging circuit which uses many of the same components as the present invention is disclosed in U.S. Pat. No. 5,307,000.

It will be appreciated from the above that the present invention provides a method and an apparatus for quickly determining the condition or charge parameters of a battery, such as the maximum charge capacity of a battery and the present charge of a battery. The present invention therefore allows users to determine whether a particular battery will be able to support a given project or whether it is time to start, stop, or alter the charging process for the battery.

Although the present invention has been described with particularity with respect to its preferred embodiment and environment, the present invention is not limited to simply determining the present condition and charge of a battery. The present invention is also usefull for determining how much charge should be applied to fully recharge a battery, and for testing to determine if a battery is fully charged or should be charged further.

From a reading of the description above of the preferred embodiment of the present invention, modifications and variations thereto may occur to those skilled in the art. Therefore, the scope of the present invention is to be limited only by the claims below.

We claim:

1. A method for determining a charge parameter of a battery, comprising:

applying a rest period to said battery;

applying a discharge pulse to said battery;

measuring a first loaded circuit voltage of said battery at a first point during said discharge pulse;

measuring a second loaded circuit voltage of said battery at a second point during said discharge pulse;

determining a difference voltage by subtracting said second loaded circuit voltage from said first loaded circuit voltage;

using said difference voltage to determine at least one of the following charge parameters: the present charge capacity of said battery, an operating curve for said battery, and an operating point of an operating curve of said battery; and outputting said charge parameter.

2. A method for determining a charge parameter of a battery, comprising:

applying a rest period to said battery;

applying a discharge pulse to said battery;

measuring an open circuit voltage of said battery during said rest period;

measuring a first loaded circuit voltage of said battery at a first point during said discharge pulse;

measuring a second loaded circuit voltage of said battery at a second point during said discharged pulse;

determining a difference voltage by substracting said second loaded circuit voltage from said first loaded circuit voltage;

using said open circuit voltage and said difference voltage to determine at least one of the following charge parameters: the present charge capacity of said battery, and operating curve for said battery, and an operating point on an operating curve of said battery; and outputting said charge parameter.

3. The method of claim 1 or 2 wherein said first loaded circuit voltage is measured at the beginning of said discharge pulse and said second loaded circuit voltage is measured just prior to the end of said discharge pulse.

4. A method for determining a charge parameter of a battery, comprising:

applying a plurality of rest periods and a plurality of discharge pulses to said battery;

measuring a first circuit voltage of said battery during a first selected one of said discharge pulses;

measuring a second loaded circuit voltage of said battery during a second selected one of said discharge pulses which is subsequent to said first selected one of said discharge pulses;

determining a difference voltage by subtracting said second loaded circuit voltage from said first loaded circuit voltage;

using said difference voltage to determine at least one of the following charge parameters: the present charge capacity of said battery, an operating curve for said battery, and an operating point on an operating curve of said battery; and outputting said charge parameter.

5. A method for determining a charge parameter of a battery, comprising:

applying a plurality of rest periods and a plurality of discharge pulses to said battery;

measuring an open circuit voltage of said battery during a first selected one of said rest periods;

measuring a first loaded circuit voltage of said battery during a first selected one of said discharge pulses which is subsequent to said first selected one of said rest periods;

measuring a second loaded circuit voltage of said battery during a second selected one of said discharge pulses which is subsequent to said first selected one of said discharge pulses;

determining a difference voltage by subtracting said second loaded circuit voltage from said first loaded circuit voltage;

using said open circuit voltage and said difference voltage to determine at least one of the following charge parameters: the present charge capacity of said battery, an operating curve for said battery, and an operating point on an operating curve of said battery; and outputting said charge parameter.

6. The method of claim 4 or 5 wherein said first loaded circuit voltage is measured just prior to the end of said first selected one of said discharge pulses.

7. The method of claim 4 or 5 wherein said second loaded circuit voltage is measured just prior to the end of said second selected one of said discharge pulses.

8. A method for determining a charge parameter of a battery, comprising:

applying a plurality of rest periods and a plurality of discharge pulses to said battery;

measuring a first loaded circuit voltage of said battery at a first point during a selected one of said discharge pulses;

measuring a second loaded circuit voltage of said battery at a second point during said selected one of said discharge pulses;

determining a difference voltage by subtracting said second loaded circuit voltage from said first loaded circuit voltage;

using said difference voltage to determine at least one of the following charge parameters: the present charge capacity of said battery, an operating curve for said battery, and an operating point on an operating curve of said battery; and outputting said charge parameter.

9. A method for determining a charge parameter of a battery, comprising:

applying a plurality of rest periods and a plurality of discharge pulses to said battery;

measuring an open circuit voltage during a selected one of said rest periods;

measuring a first loaded circuit voltage of said battery at a first point during a selected one of said discharge pulses which is subsequent to said selected one of said rest periods;

measuring a second loaded circuit voltage of said battery at a second point during said first selected one of said discharge pulses;

determining a difference voltage by subtracting said second loaded circuit voltage from said first loaded circuit voltage;

using said first open circuit voltage and said difference voltage to determine at least one of the following charge parameters: the present charge capacity of said battery, an operating curve for said battery, and an operating point on an operating curve of said battery; and outputting said charge parameter.

10. The method of claim 8 or 9 wherein said first loaded circuit voltage is measured at the beginning of said selected one of said discharge pulses and said second loaded circuit voltage is measured just prior to the end of said selected one of said discharge pulses.

11. The method of any one of claims 1, 2, 4, 5, 8 or 9 wherein said step of using said difference voltage comprises using said difference voltage as an index to a look-up table and obtaining said charge parameter from said look-up table.

12. The method of any one of claims 1, 2, 4, 5, 8 or 9 wherein said step of using said difference voltage comprises using said difference voltage as a variable in an equation and calculating said charge parameter from said equation.

13. The method of any one of claims 1, 2, 4, 5, 8 or 9 wherein said stop of using said difference voltage comprises using said difference voltage as an index to a look-up table to obtain the charge capacity for said battery from said look-up table, and using said open circuit voltage and said charge capacity to determine the present charge of said battery.

14. The method of any one of claims 1, 2, 4, 5, 8 or 9 wherein said step of using said difference voltage comprises using said difference voltage as a variable in an equation to obtain the charge capacity for said battery using said equation, and using said open circuit voltage and said charge capacity to determine the present charge of said battery.

15. A method for determining a charge parameter of a battery, comprising:

applying a plurality of rest periods and a plurality of discharge pulses to said battery;

measuring a first loaded circuit voltage of said battery at a first point during a first selected one of said discharge pulses;

measuring a second loaded circuit voltage of said battery at a second point during said first selected one of said discharge pulses;

determining a first difference voltage by subtracting said second loaded circuit voltage from said first loaded circuit voltage;

measuring a third loaded circuit voltage of said battery at a first point during a second selected one of said discharge pulses which is subsequent to said first selected one of said discharge pulses;

measuring a fourth loaded circuit voltage of said battery at a second point during said second selected one of said discharge pulses;

determining a second difference voltage by subtracting said fourth loaded circuit voltage from said third loaded circuit voltage;

combining said first difference voltage and said second difference voltage to provide a resultant difference;

using said resultant difference to determine a charge parameter of said battery; and outputting said charge parameter.

16. A method for determining a charge parameter of a battery, comprising:

applying a plurality of rest periods and a plurality of discharge pulses to said battery;

measuring an open circuit voltage during a selected one of said rest periods;

measuring a first loaded circuit voltage of said battery at a first point during a first selected one of said discharge pulses which is subsequent to said selected one of said rest periods;

measuring a second loaded circuit voltage of said battery at a second point during, said first selected one of said discharge pulses;

determining a first difference voltage by subtracting said second loaded circuit voltage from said first loaded circuit voltage;

measuring a third loaded circuit voltage of said battery at a first point during a second selected one of said discharge pulses which is subsequent to said first selected one of said discharge pulses;

measuring a fourth loaded circuit voltage of said battery at a second point during said second selected one of said discharge pulses;

determining a second difference voltage by subtracting said fourth loaded circuit voltage from said third loaded circuit voltage;

combining said first difference voltage and said second difference voltage to provide a resultant difference;

using, said open circuit voltage and said resultant difference to determine a charge parameter of said battery; and outputting said charge parameter.

17. The method of claim 15 or 16 wherein said first loaded circuit voltage is measured at the beginning of said first selected one of said discharge pulses and said second loaded circuit voltage is measured just prior to the end of said first selected one of said discharge pulses.

18. The method of claim 15 or 16 wherein said first loaded circuit voltage is measured at the beginning of said first selected one of said discharge pulses,an said second loaded circuit voltage is measured just prior to the end of said first selected one of said discharge pulses said third loaded circuit voltage is measured at the beginning of said second selected one of said discharge pulses, and said fourth loaded circuit voltage is measured just prior to the end of said second selected one of said discharge pulses.

19. The method of claim 15 or 16 wherein said step of combining comprises adding said first difference voltage to said second difference voltage.

20. The method of claim 15 or 16 wherein said step of combining comprises multiplying said first difference voltage by said second difference voltage.

21. The method of claim 15 or 16 wherein said charge parameter is the present charge of said battery.

22. The method of claim 15 or 16 wherein said charge parameter is the present charge capacity of said battery.

23. The method of claim 15 or 16 wherein said charge parameter is an operating curve for said battery.

24. The method of claim 15 or 16 wherein said charge parameter is an operating point on an operating curve for said battery.

25. The method of claim 15 or 16 wherein said step of using said resultant difference comprises using said resultant difference as an index to a look-up table and obtaining said charge parameter from said look-up table.

26. The method of claim 15 or 16 wherein said step of using said resultant difference comprises using said resultant difference as a variable in an equation and calculating said charge parameter from said equation.

27. The method of claim 15 or 16 wherein said step of using said resultant difference comprises using said resultant difference as an index to a look-up table to obtain the charge capacity for said battery from said look-up table, and using said open circuit voltage and said charge capacity to determine the present charge of said battery.

28. The method of claim 15 or 16 wherein said step of using said resultant difference comprises using said resultant difference as a variable in an equation to obtain the charge capacity for said battery using said equation, and using said open circuit voltage and said charge capacity to determine the present charge of said battery.

29. The method of any one of claims 4, 5, 15 or 16 wherein said selected ones of said discharge pulses have the same current amplitude.

30. The method of any one of claims 4, 5, 15 or 16 wherein said first selected one of said discharge pulses has a first current amplitude, said second selected one of said discharge pulses has a second current amplitude, and said first current amplitude is different than said second current amplitude.

* * * * *